(12) United States Patent
Itamochi

(10) Patent No.: US 10,262,801 B2
(45) Date of Patent: Apr. 16, 2019

(54) MULTILAYER CERAMIC ELECTRONIC COMPONENT

(71) Applicant: Murata Manufacturing Co., Ltd., Nagaokakyo-shi, Kyoto-fu (JP)

(72) Inventor: Masakazu Itamochi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/659,682

(22) Filed: Jul. 26, 2017

(65) Prior Publication Data
US 2018/0033556 A1 Feb. 1, 2018

(30) Foreign Application Priority Data

Jul. 27, 2016 (JP) ................. 2016-147598

(51) Int. Cl.
| | |
|---|---|
| *H01G 4/30* | (2006.01) |
| *H01G 4/228* | (2006.01) |
| *H01C 7/00* | (2006.01) |
| *H01G 4/012* | (2006.01) |
| *H01G 4/12* | (2006.01) |
| *H01G 4/248* | (2006.01) |
| *H01L 41/047* | (2006.01) |
| *H01L 41/083* | (2006.01) |

(Continued)

(52) U.S. Cl.
CPC ............. *H01G 4/30* (2013.01); *H01C 7/008* (2013.01); *H01F 17/0013* (2013.01); *H01F 27/292* (2013.01); *H01G 4/012* (2013.01); *H01G 4/1227* (2013.01); *H01G 4/248* (2013.01); *H01L 41/0471* (2013.01); *H01L 41/0472* (2013.01); *H01L 41/0477* (2013.01); *H01L 41/083* (2013.01); *H01L 41/1876* (2013.01); *H01F 1/34* (2013.01)

(58) Field of Classification Search
CPC ........... H01G 4/30; H01G 4/228; H01G 4/232
See application file for complete search history.

(56) References Cited

U.S. PATENT DOCUMENTS

| | | | | |
|---|---|---|---|---|
| 6,191,933 B1 * | 2/2001 | Ishigaki | ................. | H01G 4/232 |
| | | | | 361/309 |
| 6,288,887 B1 * | 9/2001 | Yoshida | ................. | H01G 4/232 |
| | | | | 361/306.1 |

(Continued)

FOREIGN PATENT DOCUMENTS

| | | |
|---|---|---|
| JP | 62-174332 U | 11/1987 |
| JP | 2001-189232 A | 7/2001 |

(Continued)

*Primary Examiner* — Eric W Thomas
(74) *Attorney, Agent, or Firm* — Keating & Bennett, LLP

(57) ABSTRACT

A multilayer ceramic electronic component includes an electronic component body including a laminate and an external electrode, and a pair of metal terminals that are joined by a joining material. The pair of metal terminals includes a terminal joint portion, an extended portion and a mounting portion. The external electrode is provided only on both end surfaces of the laminate, and includes first and second external electrodes. The first external electrode and the second external electrode each include a saddle portion with a thickness larger than the thickness of a center portion of each end surface in the periphery of the first end surface and the second end surface of the laminate, respectively.

20 Claims, 10 Drawing Sheets

A-A SECTION VIEW

(51) Int. Cl.
*H01L 41/187* (2006.01)
*H01F 17/00* (2006.01)
*H01F 27/29* (2006.01)
*H01F 1/34* (2006.01)

(56) References Cited

U.S. PATENT DOCUMENTS

| | | |
|---|---|---|
| 8,830,654 B2 | 9/2014 | Haruki et al. |
| 9,136,056 B2 | 9/2015 | Haruki et al. |
| 2013/0020905 A1* | 1/2013 | Sawada ............. H01G 4/30 |
| | | 310/311 |

FOREIGN PATENT DOCUMENTS

| | | | |
|---|---|---|---|
| JP | 2004146401 A | * | 5/2004 |
| JP | 2006-202937 A | | 8/2006 |
| JP | 2010-147309 A | | 7/2010 |

* cited by examiner

A-A SECTION VIEW

B-B SECTION VIEW

A-A SECTION VIEW

24a } 24  18a } 18  16a } 16
24b }      18b }      16b }

D-D SECTION VIEW

110C

MULTILAYER CERAMIC ELECTRONIC COMPONENT

CROSS REFERENCE TO RELATED APPLICATIONS

This application claims the benefit of priority to Japanese Patent Application No. 2016-147598 filed on Jul. 27, 2016. The entire contents of this application are hereby incorporated herein by reference.

BACKGROUND OF THE INVENTION

1. Field of the Invention

The present invention relates to a multilayer ceramic electronic component including, for example, a multilayer ceramic capacitor or the like.

2. Description of the Related Art

In recent years, a multilayer ceramic capacitor (electronic component body) which is a chip-type electronic component made of ceramic has been commonly used. However, when a multilayer ceramic capacitor is directly mounted by a solder on a mounting board, the mounting board on which the multilayer ceramic capacitor is mounted and the multilayer ceramic capacitor expand or contract according to the respective coefficients of thermal expansion when the temperature changes, and the difference in coefficient of thermal expansion between these elements causes a stress that leads, for example, the damage of the multilayer ceramic capacitor or the breakage of the joint. Also, when the mounting board is liable to bend as in the case of a thin glass epoxy board, a stress similar to when the mounting board bends can occur. Further, when a force is exerted on the mounting board itself, the mounting board bends and deforms, and thus a stress can similarly occur.

Such a stress exerted on a multilayer ceramic capacitor can cause occurrence of cracking in the multilayer ceramic capacitor.

In order to solve the aforementioned problem, it has been proposed to attach a metal terminal formed of a metal plate on the external electrode of the multilayer ceramic capacitor, and a metal terminal member is soldered to the mounting board in the condition that the multilayer ceramic capacitor is lifted off the mounting board (see, for example, Japanese Patent Application Laid-Open No. 2001-189232).

According to such a method, the heat at the time of soldering propagates to the multilayer ceramic capacitor via the metal terminal, so that it is possible to prevent the thermal shock from being exerted on the multilayer ceramic capacitor. Further, even when a stress due to temperature change or deformation of the mounting board occurs, it can be advantageously absorbed by the elastic deformation of the metal terminal.

However, even when a metal terminal is provided, cracking sometimes occurs in the multilayer ceramic capacitor. As a result of diligent effort, the inventors discovered that this is caused by occurrence of a tensile (compressive) stress in a plating film formed on the surface of the metal terminal and the external electrode, and cracking occurs from the end portion of the external electrode where the stress is most concentrated toward inside the multilayer ceramic capacitor.

SUMMARY OF THE INVENTION

Therefore, preferred embodiments of the present invention provide multilayer ceramic electronic components capable of preventing occurrence of cracking of electronic component bodies of the multilayer ceramic electronic components.

A multilayer ceramic electronic component according to a preferred embodiment of the present invention is a multilayer ceramic electronic component including an electronic component body that is a laminate including a plurality of laminated ceramic layers and a plurality of laminated internal electrode layers, and including first and second principal surfaces that are opposed to each other, first and second lateral surfaces that are opposed to each other, and first and second end surfaces that are opposed to each other, a first external electrode connected with the first end surface of the laminate, and a second external electrode connected with the second end surface of the laminate; a first metal terminal connected with the first external electrode; and a second metal terminal connected with the second external electrode, wherein the first and second external electrodes are disposed on the first and second end surfaces; the first and second external electrodes include a portion having a thickness larger than a thickness of a center portion of the first and second end surfaces in peripheries of the first and second end surfaces in planar view from a direction linking the first and second end surfaces; the first metal terminal includes a terminal joint portion connected with the first end surface, an extended portion connected with the terminal joint portion and extending in a mounting surface direction, and a mounting portion connected with the extended portion and extending in a direction linking the end surfaces from the extended portion; the second metal terminal includes a terminal joint portion connected with the second end surface, an extended portion connected with the terminal joint portion and extending in a direction of a mounting surface, and a mounting portion connected with the extended portion and extending in a direction linking the end surfaces from the extended portion; and the extended portion defines a gap between a bottom surface of the electronic component body and the mounting portion.

Preferably, in a multilayer ceramic electronic component according to a preferred embodiment of the present invention, the portion having the larger thickness of the first and the second external electrodes surrounds peripheries of the first and the second end surfaces.

Also, in a multilayer ceramic electronic component according to a preferred embodiment of the present invention, preferably, a base material of the first and the second metal terminals is phosphor bronze.

According to a multilayer ceramic electronic component of a preferred embodiment of the present invention, since the first and the second external electrodes are disposed only on the first and the second end surfaces, it becomes possible to reduce the tensile stress on an e-dimensional end portion due to reduction in the total volume of the first and the second external electrodes (the base electrode layer and the plating layer), and it is possible to prevent occurrence of cracking from the e-dimensional end portion of the external electrodes.

Also, according to a multilayer ceramic electronic component of a preferred embodiment of the present invention, since the first and the second external electrodes include a portion having a thickness larger than the thickness of the center portion of the first and the second end surfaces in the peripheries of the first and the second end surfaces in planar view from the direction linking the first and the second end surfaces, it is possible to ensure the thickness of the first and the second external electrodes in corner portions of the laminate, and thus it is possible to ensure the sealability of the first and the second external electrodes to the laminate.

Further, according to a multilayer ceramic electronic component of a preferred embodiment of the present invention, since the first metal terminal connected with the first external electrode, and the second metal terminal connected with the second external electrode have a terminal joint portion connected with each external electrode, an extended portion connected with the terminal joint portion and extending in the direction of a mounting surface, and a mounting portion connected with the extended portion and extending in the direction linking the end surfaces from the extended portion, the extended portion defines a gap between the bottom surface of the electronic component body and the mounting portion, and by interposing the metal terminal between the multilayer ceramic electronic component and the mounting board, it is possible to prevent the thermal shock from being exerted on the electronic component body. Thus, solder cracking resistance is improved. Also, even when a stress due to temperature change, or deformation of the mounting board occurs, the stress is absorbed advantageously by the elastic deformation of the metal terminal.

Further, when the portions having larger thicknesses of the first and the second external electrodes are provided to surround peripheries of the first and the second end surfaces, it is possible to further ensure the thickness of the external electrode in corner portions of the laminate, and thus it is possible to further ensure the sealability of the external electrode to the laminate.

Further, when the base material of the first and the second metal terminals is phosphor bronze, it is desirably used as a base material for the first and the second metal terminals for amelioration of heat generation because it has excellent heat conductivity and low electric resistance.

According to various preferred embodiments of the present invention, it is possible to obtain multilayer ceramic electronic components capable of preventing occurrence of cracking of electronic component bodies of the multilayer ceramic electronic components.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
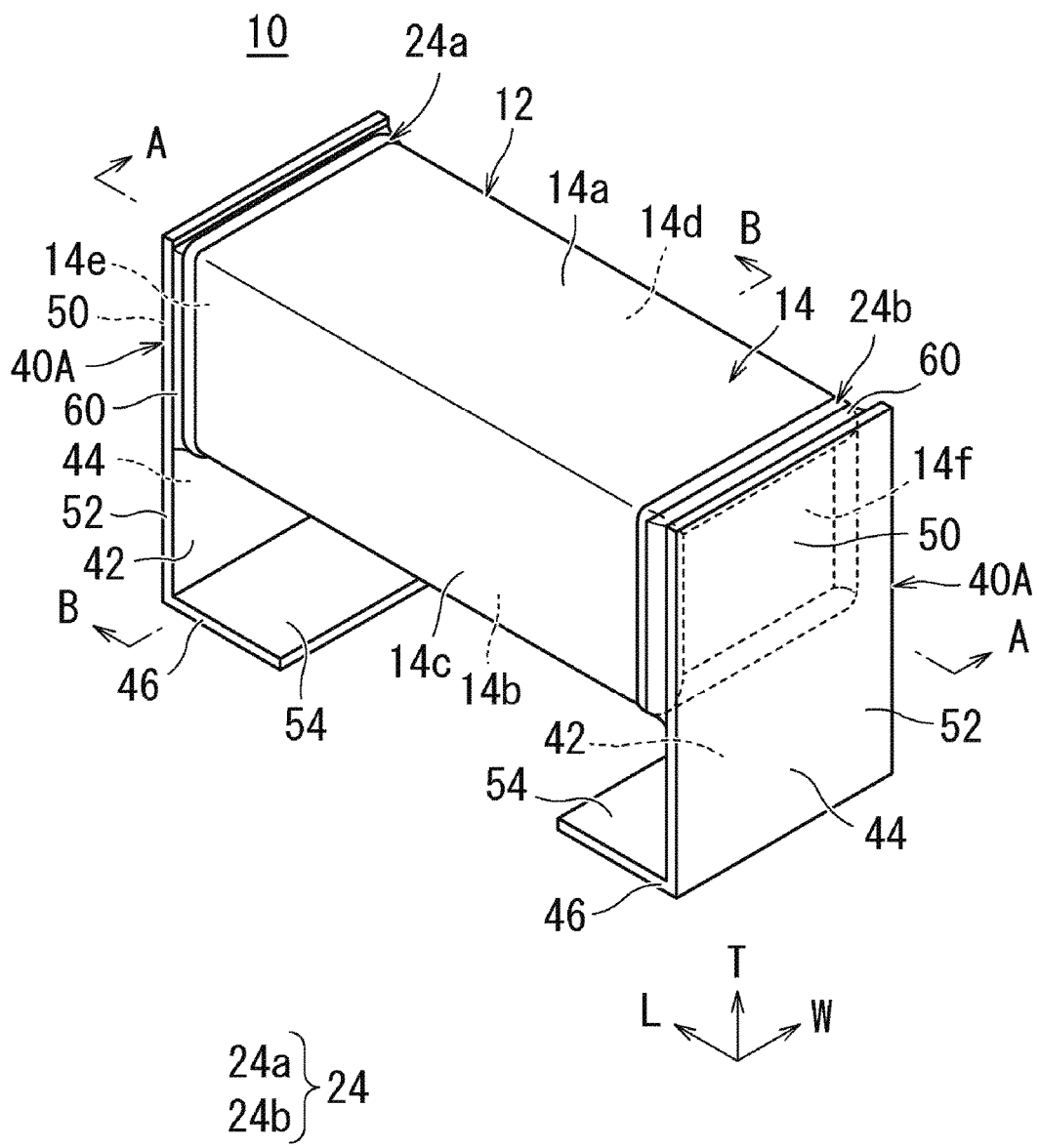
FIG. 1 is an external perspective view showing one example of a multilayer ceramic electronic component according to the first preferred embodiment of the present invention.
Figure 2A:
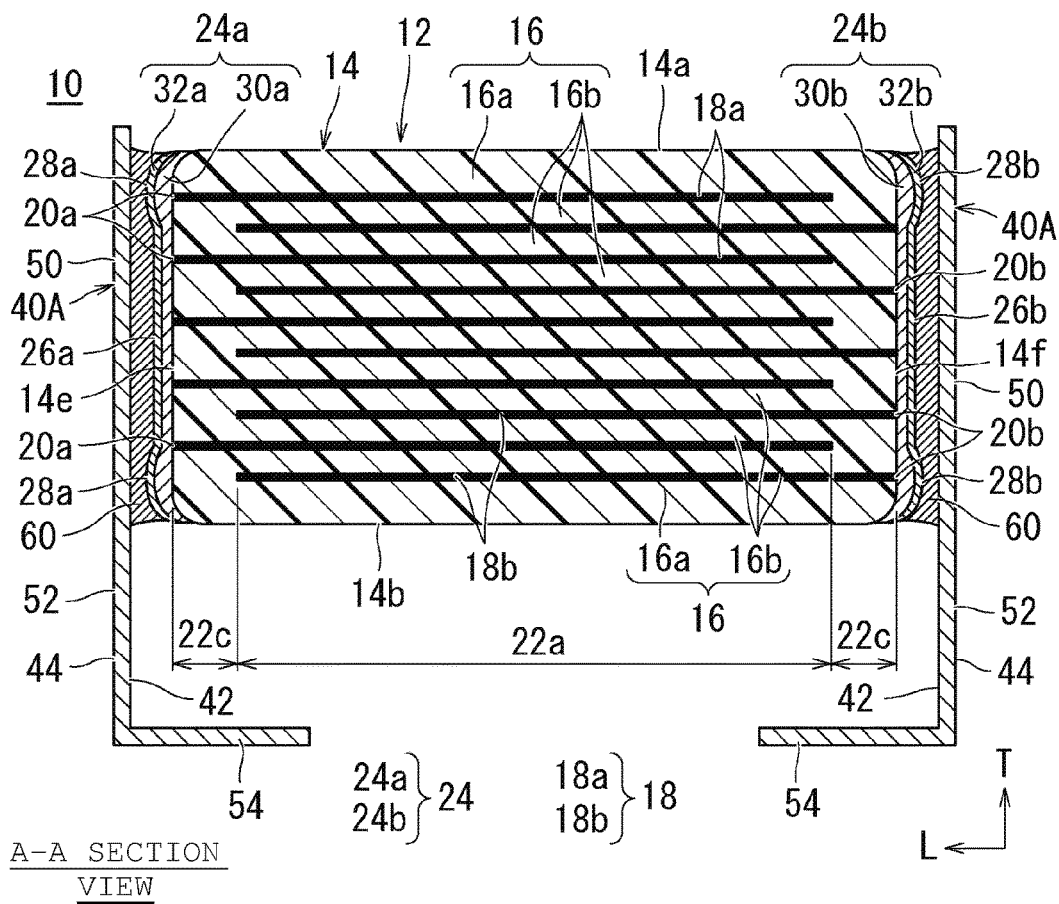
FIG. 2A is a section view taken along A-A of FIG. 1 showing the multilayer ceramic electronic component according to the first preferred embodiment of the present invention.
Figure 2B:
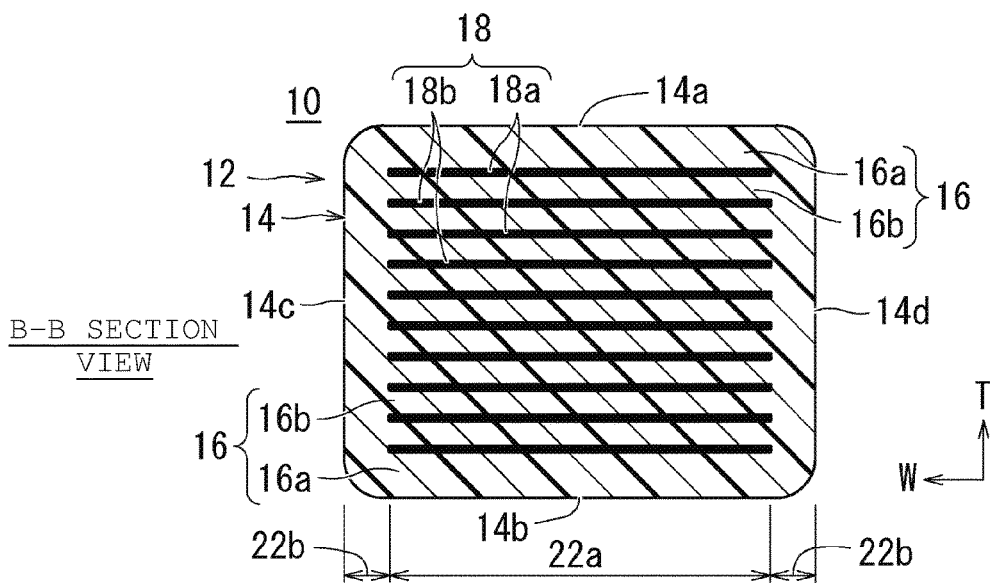
FIG. 2B is a section view taken along B-B of FIG. 1 showing the multilayer ceramic electronic component according to the first preferred embodiment of the present invention.
Figure 3A:
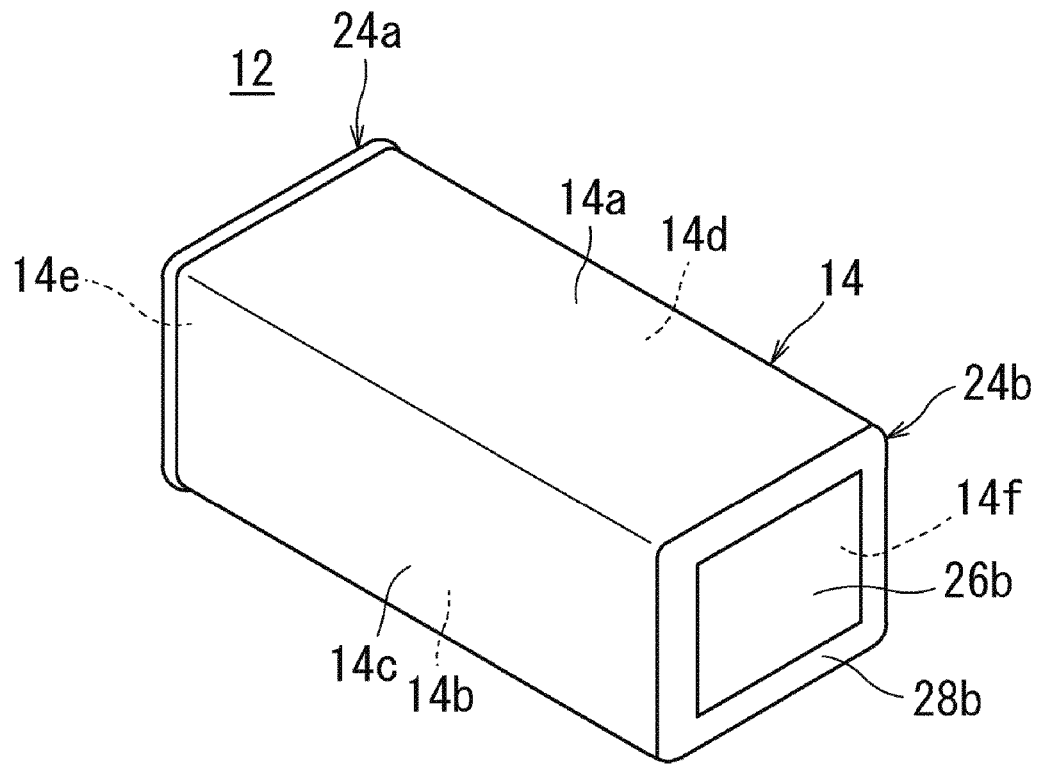
FIG. 3A is an external perspective view showing one example of an electronic component body of the multilayer ceramic electronic component according to the first preferred embodiment of the present invention.
Figure 3B:
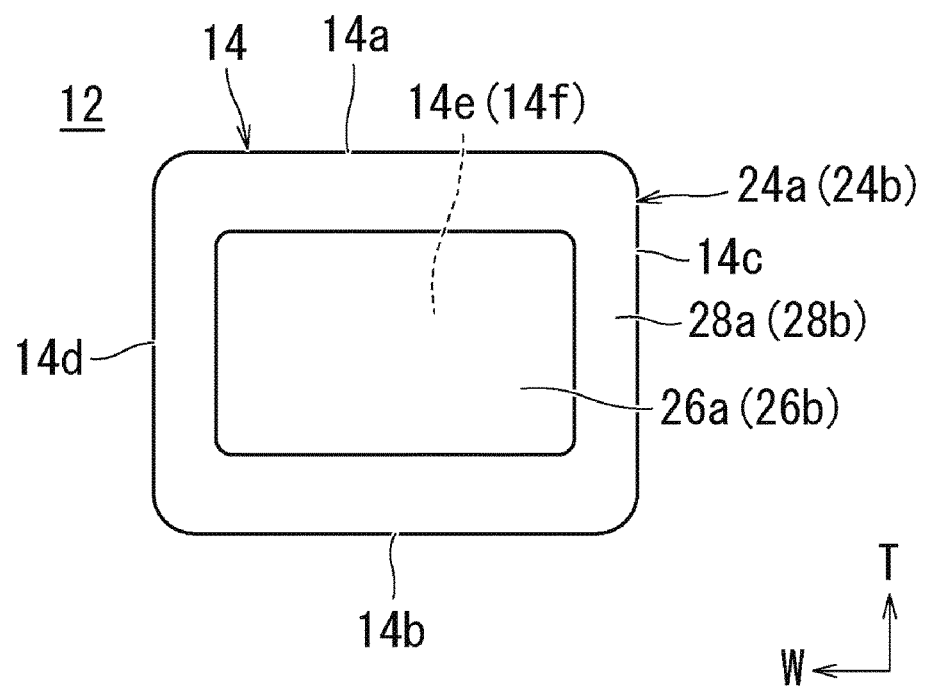
FIG. 3B illustrates an external electrode when the electronic component body of the multilayer ceramic electronic component according to the first preferred embodiment of the present invention is viewed from a WT plane.
Figure 4:
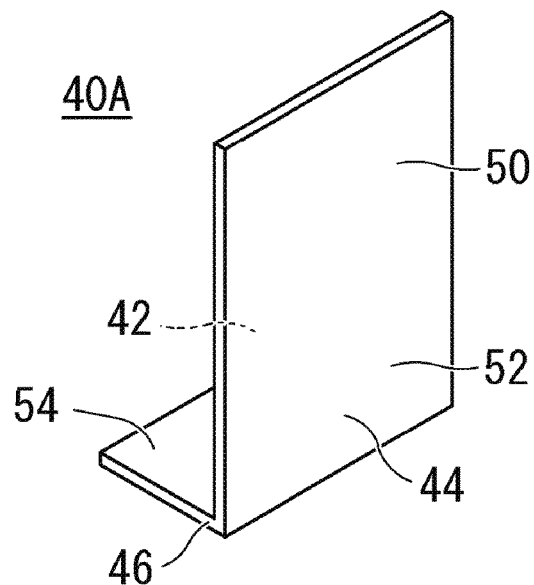
FIG. 4 is an external perspective view showing a metal terminal included in the multilayer ceramic electronic component of the first preferred embodiment according to the present invention

A multilayer ceramic electronic component according to the first preferred embodiment of the present invention will be described. FIG. 1 is an external perspective view showing one example of a multilayer ceramic electronic component according to the first preferred embodiment of the present invention. FIG. 2A is a section view taken along A-A of FIG. 1 showing the multilayer ceramic electronic component according to the first preferred embodiment of the present invention, and FIG. 2B is a section view taken along B-B of FIG. 1 showing the multilayer ceramic electronic component according to the first preferred embodiment of the present invention. FIG. 3A is an external perspective view showing one example of an electronic component body of the multilayer ceramic electronic component according to the first preferred embodiment of the present invention, and FIG. 3B illustrates an external electrode when the electronic component body of the multilayer ceramic electronic component according to the first preferred embodiment of the present invention is viewed from a WT plane. FIG. 4 is an external perspective view showing a metal terminal included in the multilayer ceramic electronic component of the first preferred embodiment according to the present invention.

As shown in FIG. 1 and FIG. 2, a multilayer ceramic electronic component 10 includes, for example, an electronic component body 12 and a pair of metal terminals 40A. The electronic component body 12 and the pair of metal terminals 40A are connected by a joining material 60.

The electronic component body 12 includes a laminate 14 preferably in the form of a rectangular or substantially rectangular parallelepiped.

The laminate 14 includes a plurality of laminated ceramic layers 16 and a plurality of internal electrode layers 18. Further, the laminate 14 includes a first principal surface 14a and a second principal surface 14b that are opposed to each other in a thickness direction T, a first lateral surface 14c and a second lateral surface 14d that are opposed to each other in a width direction W orthogonal to the thickness direction T, and a first end surface 14e and a second end surface 14f that are opposed to each other in a length direction L orthogonal to the thickness direction T and the width direction W. In the laminate 14, it is preferred that ridge portions and corner portions are rounded. The corner portion refers to the portion where three adjacent surfaces of the laminate intersect one another, and the ridge portion refers to the portion where two adjacent surfaces of the laminate intersect with each other.

The ceramic layer 16 includes an outer layer portion 16a and an inner layer portion 16b. The outer layer portion 16a is situated on the first principal surface 14a side and on the second principal surface 14b side of the laminate 14, and is the ceramic layer 16 that is situated between the first principal surface 14a and the internal electrode layer 18 nearest to the first principal surface 14a, and is the ceramic layer 16 that is situated between the second principal surface 14b and the internal electrode layer 18 nearest to the second principal surface 14b. And the region sandwiched between these outer layer portions 16a is the inner layer portion 16b.

The ceramic layer 16 can be formed of, for example, a dielectric material. As the dielectric material, for example, dielectric ceramics containing an ingredient such as $BaTiO_3$, $CaTiO_3$, $SrTiO_3$, or $CaZrO_3$ can be used. When such a dielectric material is contained as a main ingredient, an ingredient such as a Mn compound, a Fe compound, a Cr compound, a Co compound, or a Ni compound that is contained in a smaller amount than the main ingredient may be added depending on the intended characteristics of the electronic component body 12.

When a piezoelectric ceramic is used for the laminate 14, the electronic component body defines and functions as a ceramic piezoelectric element. Specific examples of the piezoelectric ceramic material include PZT (lead zirconate titanate) type ceramic materials.

Also, when a semiconductor ceramic is used for the laminate 14, the electronic component body defines and functions as a thermistor element. Specific examples of the semiconductor ceramic material include spinel type ceramic materials.

When a magnetic ceramic is used for the laminate 14, the electronic component body defines and functions as an inductor element. When it defines and functions as an inductor element, the internal electrode layer 18 is a coiled conductor. Specific examples of the magnetic ceramic material include ferrite ceramic materials.

The thickness of the ceramic layer 16 after firing is preferably about 0.5 μm or more and about 10 μm or less, for example.

As shown in FIG. 2, the laminate 14 includes, as the plurality of internal electrode layers 18, a plurality of first internal electrode layers 18a and a plurality of second internal electrode layers 18b having, for example, a rectangular or substantially rectangular shape. The plurality of first internal electrode layers 18a and the plurality of second internal electrode layers 18b are embedded so that they are arranged alternately at regular intervals along the thickness direction T of the laminate 14.

Each electrode surface of the first internal electrode layers 18a and the second internal electrode layers 18b is arranged perpendicularly to the direction in which the metal terminal 40A extends, and is arranged so that it is parallel with a mounting surface.

Thus, by arranging in the direction in which displacement of the ceramic by electrostriction is small, concentration of the stress is significantly reduced or minimized, and a BDV (breakdown voltage) that is close to that in the case of using the multilayer ceramic electronic component 10 alone is obtained, and sufficiently satisfactory characteristics of the product are achieved.

The first internal electrode layer 18a has on one end side a first extended electrode portion 20a extended to the first end surface 14e of the laminate 14. The second internal electrode layer 18b has on one end side a second extended electrode portion 20b extended to the second end surface 14f of the laminate 14. Specifically, the first extended electrode portion 20a on one end side of the first internal electrode layer 18a is exposed to the first end surface 14e of the laminate 14. The second extended electrode portion 20b on one end side of the second internal electrode layer 18b is exposed to the second end surface 14f of the laminate 14.

The internal electrode layers 18 may be arranged so that they are parallel with the mounting surface, or may be arranged so that they are perpendicular to the mounting surface.

The laminate 14 includes an opposed electrode portion 22a where the first internal electrode layer 18a and the second internal electrode layer 18b are opposed to each other in the inner layer portion 16b of the ceramic layer 16. Also, the laminate 14 includes a lateral portion (hereinafter, referred to as "W gap") 22b of the laminate 14 between one end in the width direction W of the opposed electrode portion 22a and the first lateral surface 14c, and between the other end in the width direction W of the opposed electrode portion 22a and the second lateral surface 14d. Further, the laminate 14 includes an end portion (hereinafter, referred to as "L gap") 22c of the laminate 14 between the end portion on the side opposite to the first extended electrode portion 20a of the first internal electrode layer 18a and the second end surface 14f, and between the end portion on the side opposite to the second extended electrode portion 20b of the second internal electrode layer 18b and the first end surface 14e.

The internal electrode layer 18 contains metal such as Ni, Cu, Ag, Pd, or Au, or an alloy containing one of these metals such as Ag—Pd alloy. The internal electrode layer 18 may contain dielectric particles of the same composition system as the ceramics contained in the ceramic layer 16.

The thickness of the internal electrode layer 18 is preferably about 0.1 μm or more and about 2 μm or less, for example.

On the first end surface 14e side and on the second end surface 14f side of the laminate 14, an external electrode 24 is disposed. The external electrode 24 has a first external electrode 24a and a second external electrode 24b.

The first external electrode 24a is disposed only on the first end surface 14e side of the laminate 14. The first external electrode 24a covers the first end surface 14e of the laminate 14. In this case, the first external electrode 24a is electrically connected with the first extended electrode portion 20a of the first internal electrode layer 18a.

The second external electrode 24b is disposed only on the second end surface 14f side of the laminate 14. The second external electrode 24b covers the second end surface 14f of the laminate 14. In this case, the second external electrode 24b is electrically connected with the second extended electrode portion 20b of the second internal electrode layer 18b.

In the laminate 14, the first internal electrode layer 18a and the second internal electrode layer 18b are opposed to each other with the ceramic layer 16 interposed therebetween in each opposed electrode portion 22a, and thus an electrostatic capacitance is generated. Therefore, it is possible to obtain an electrostatic capacitance between the first external electrode 24a to which the first internal electrode layer 18a is connected, and the second external electrode 24b to which the second internal electrode layer 18b is connected. Therefore, the electronic component body having such a structure defines and functions as a capacitor element.

As shown in FIG. 3, the first external electrode 24a has a saddle portion 28a having a thickness larger than the thickness of the first external electrode 24a in a center portion (end surface center portion 26a) of the first end surface 14e in the periphery of the first end surface 14e in planar view from the direction linking the first end surface 14e and the second end surface 14f for the first end surface 14e. The end surface center portion 26a is preferably flat or substantially flat.

Similarly, the second external electrode 24b includes a saddle portion 28b having a thickness larger than the thickness of the second external electrode 24b in a center portion (end surface center portion 26b) of the second end surface 14f in the periphery of the second end surface 14f in planar view from the direction linking the first end surface 14e and the second end surface 14f for the second end surface 14f. Also, the end surface center portion 26b is flat or substantially flat.

The heights of the saddle portions 28a and 28b are preferably higher by about 0.1 µm or more and about 5.0 µm or less, for example, on the basis of the heights of the end surface center portions 26a and 26b. More preferably, they are higher by about 2.0 µm or more and about 5.0 µm or less, for example. When the heights of the saddle portions 28a and 28b fall within the above range of height, it is possible to prevent deterioration of the joining strength while sufficiently ensuring the sealability of the external electrode 24 to the laminate 14.

As shown in FIG. 2, the first external electrode 24a includes a base electrode layer 30a, and a plating layer 32a disposed on the surface of the base electrode layer 30a in sequence from the laminate 14 side. Similarly, the second external electrode 24b includes a base electrode layer 30b and a plating layer 32b disposed on the surface of the base electrode layer 30b in sequence from the laminate 14 side.

The base electrode layers 30a and 30b each contain at least one selected from a baked layer, a resin layer, a thin film layer and so on, and in this description, the base electrode layers 30a and 30b formed of a baked layer will be described.

The baked layer contains glass and metal. As the glass in the baked layer, at least one selected from Si, B, Pb, Be and so on is contained. As the metal in the baked layer, for example, at least one selected from Cu, Ni, Ag, Pb, Ag—Pb alloy, Au and so on is contained. The baked layer may include a plurality of layers. The baked layer is obtained by applying a conductive paste containing glass and metal on the laminate 14 and baking the paste, and may be fired simultaneously with the ceramic layer 16 and the internal electrode layer 18, or may be baked after firing the ceramic layer 16 and the internal electrode layer 18. The thickness of the thickest part in the baked layer is preferably about 10 µm or more and about 50 µm or less, for example.

On the surface of the baked layer, a resin layer containing conductive particles and a thermosetting resin may be provided. The resin layer may be directly provided on the laminate 14 without providing the baked layer. The resin layer may include a plurality of layers. The thickness of the thickest portion in the resin layer is preferably about 10 µm or more and about 150 µm or less, for example.

The thin film layer is formed by a thin film forming method such as a sputtering method or a vapor deposition method, and is a layer of about 1 µm or less in which metal particles are deposited, for example.

As the plating layers 32a and 32b, for example, at least one metal or an alloy containing such a metal selected from Cu, Ni, Sn, Ag, Pd, Ag—Pd alloy, Au, Bi, Zn and so on is used.

The plating layers 32a and 32b may be formed of a plurality of layers. The plating layers 32a and 32b preferably have a two-layer structure including a first plating layer disposed on the surface of the baked layer, and a second plating layer disposed on the surface of the first plating layer.

Preferably, Ni is used for the first plating layer. The first plating layer in which Ni is used to prevent the base electrode layers 30a and 30b from being eroded by the solder at the time of joining the metal terminal 40A. When the internal electrode layer 18 contains Ni, it is preferred to use Cu having excellent joinability with Ni as the first plating layer.

It is preferred to use Sn or Au for the second plating layer. The second plating layer in which Sn or Au is used is used to improve the wettability of the solder in mounting the multilayer ceramic capacitor to enable easy mounting. The second plating layer is formed as needed.

Also, the second plating layer may be provided as the outermost layer of the plating layers 32a and 32b, and other plating layer may be provided on the surface of the second plating layer.

The thickness per one layer of the plating layer is preferably about 1 µm or more and about 15 µm or less, for example. Preferably, the plating layers 32a and 32b do not contain glass. Further, in the plating layers 32a and 32b, preferably, the percentage of metal per unit volume is about 99 vol % or more, for example. The plating layers 32a and 32b are formed by grain growth along the thickness direction and are columnar.

To the first external electrode 24a and the second external electrode 24b of the electronic component body 12, a pair of metal terminals 40A as shown in FIG. 4 is connected by the joining material 60. The pair of metal terminals 40A is provided to mount the multilayer ceramic electronic component 10 to the mounting board.

As the pair of metal terminals 40A, for example, plate-shaped leadframes are used. Each of the pair of metal terminals 40A defined by a plate-shaped leadframe includes one principal surface 42 connected with the first external electrode 24a or the second external electrode 24b, another principal surface 44 opposed to the one principal surface 42, and a peripheral surface 46 defining the thickness between the one principal surface 42 and the other principal surface 44. Each of the pair of metal terminals 40A defined by a plate-shaped leadframe preferably has an L-shaped cross section. When the cross section of each of the pair of metal terminals 40A is L-shaped, for example, it is possible to improve the resistance to the bending of the mounting board when the multilayer ceramic electronic component 10 is mounted on the mounting board.

The metal terminal 40A includes, for example, a terminal joint portion 50 in the form of a rectangular or substantially rectangular plate, an extended portion 52 connected with the terminal joint portion 50 and extending in the direction of the mounting surface from the terminal joint portion 50, and a mounting portion 54 connected with the extended portion 52 and extending in the direction linking the first end surface 14e and the second end surface 14f from the extended portion 52. With this configuration, by interposing the metal terminal 40A between the electronic component body 12 and the mounting board, it is possible to prevent the thermal shock from exerting on the electronic component body 12. Also, even when a stress due to temperature change, or deformation of the mounting board occurs, it can be absorbed advantageously by the elastic deformation of the metal terminal 40A.

The terminal joint portion 50 of the metal terminal 40A is a portion that is situated and connected on the first end surface 14e side or on the second end surface 14f of the electronic component body 12. The terminal joint portion 50 of the metal terminal 40A is preferably formed, for example, into a rectangular or substantially rectangular plate shape having an equivalent size with the width of the first external electrode 24a or the second external electrode 24b of the electronic component body 12, and the one principal surface 42 side of one of the metal terminals 40A is connected with the first external electrode 24a by the joining material 60, and the one principal surface 42 side of the other of the metal terminals 40A is connected with the second external electrode 24b by the joining material 60.

The terminal joint portion 50 of the metal terminal 40A may be provided with a rib extending while it is opposed to each of the lateral surfaces 14c and 14d of the electronic component body 12. By providing such a rib, it is possible to improve the stiffness of the terminal joint portion 50 of the metal terminal 40A, and for example, when a load is exerted from the length direction L of the multilayer ceramic electronic component 10, deformation of the terminal joint portion 50 is prevented. Since the joining area between the external electrode 24 and the terminal joint portion 50 of the metal terminal 40A is able to be increased, it is possible to prevent the disjoining.

The extended portion 52 of the metal terminal 40A defines a gap between the bottom surface of the electronic component body 12 (the second principal surface 14b) and the mounting portion 54. The extended portion 52 of the metal terminal 40A is provided so as to lift the electronic component body 12 off the mounting board, and is a portion spanning up to joining with the mounting board. Thus, by the elastic deformation of the metal terminal 40A, it is possible to absorb the mechanical strain occurring in the ceramic layer 16 by application of AC voltage, and to prevent the oscillation from being transferred to the mounting board via the external electrode 24, and as a result, it is possible to reduce the generation of the noises.

The extended portion 52 of the metal terminal 40A has a rectangular or substantially rectangular plate shape, and extends in the height direction that is orthogonal to the second principal surface 14b of the laminate 14 in the mounting surface direction from the terminal joint portion 50, and is formed into one plane with the terminal joint portion 50.

The mounting portion 54 of the metal terminal 40A extends in the length direction parallel with the second principal surface 14b from the end part of the extended portion 52 of the metal terminal 40A, and is bent so that it is perpendicular to the extended portion 52 of the metal terminal 40A. The mounting portion 54 of the metal terminal 40A is formed by bending the extended portion 52 of the metal terminal 40A in such a manner that it comes into contact with a mounting board. The mounting portion 54 may be bent toward the electronic component body 12 side, or may be bent toward the counter side of the electronic component body 12.

The length in the length direction L (the direction linking both end surfaces of the laminate 14) of the mounting portion 54 of the metal terminal 40A may longer than the length in the laminating direction T (the direction linking both principal surfaces of the laminate 14) of the extended portion 52 of the metal terminal 40A. The corner portion where the extended portion 52 of the metal terminal 40A and the mounting portion 54 of the metal terminal 40A intersect with each other may be rounded.

The metal terminal 40A includes a terminal body and a plating film located on the surface of the terminal body.

The terminal body is preferably formed of Ni, Fe, Cu, Ag, Cr, or an alloy containing at least one metal selected from these metals as a main ingredient. More preferably, the terminal body is formed of Ni, Fe, Cr, or an alloy containing at least one metal selected from these metals as a main ingredient. Specifically, for example, the metal of the base material of the terminal body can be a Fe-42Ni alloy or a Fe-18Cr alloy. The thickness of the terminal body of the metal terminal 40A is preferably about 0.05 mm or more and about 0.5 mm or less, for example. By forming the terminal body of Ni, Fe, Cr, or an alloy containing at least one metal selected from these metals as a main ingredient having a high melting point, it is possible to improve the heat resistance of the external electrode 24.

Here, the plating film may be provided on the entire surface of the metal terminal 40A. The plating film may not be provided on the peripheral surface 46 of the extended portion 52 and the mounting portion 54 of the metal terminal 40A. Thus, at the time of mounting the multilayer ceramic electronic component 10 on the mounting board by using a solder, wicking of the solder to the metal terminal 40A is able to be prevented. Therefore, it is possible to prevent the solder from wicking between the electronic component body 12 and the metal terminal 40A (lifting part), and thus it is possible to prevent the lifting portion from being filled with the solder. Therefore, it is possible to sufficiently ensure the space of the lifting portion. Accordingly, the extended portion 52 of the metal terminal 40A becomes easy to elastically deform, and hence, it is possible to further absorb the mechanical strain occurring in the ceramic layer 16 by application of AC voltage. As a result, it is possible to prevent transfer of the oscillation occurring at this time to the mounting board via the external electrode 24. Thus, by providing the metal terminal 40A, it is possible to prevent the occurrence of the acoustic noise more stably.

In the case of removing the plating film formed on the surface of the metal terminal 40A, or removing the plating film formed on the peripheral surface 46 of the extended portion 52 and the mounting portion 54 of the metal terminal 40A, mechanical removal (cutting, grinding), removal by laser trimming, removal by a plating remover (e.g., sodium hydroxide) and the like can be used as the removing method. For example, when a plating film is not formed on the surface of the extended portion 52 and the mounting portion 54 of the metal terminal 40A, after preliminarily coating the portion where the plating film is not formed with a resist, a plating film may be provided in the remaining part of the metal terminal 40A, and then the resist may be removed. The plating film may not be provided on the entire peripheral surface of the metal terminal 40A.

The plating film includes, for example, a lower layer plating film and an upper layer plating film.

The lower layer plating film is provided on the surface of the terminal body, and the upper layer plating film is formed on the surface of the lower layer plating film.

The lower layer plating film is preferably formed of Ni, Fe, Cu, Ag, Cr or an alloy containing at least one metal selected from these metals as a main ingredient. More preferably, the lower layer plating film is formed of Ni, Fe, Cr, or an alloy containing at least one metal selected from these metals as a main ingredient. By forming the lower layer plating film of Ni, Fe, Cr, or an alloy containing at least one metal selected from these metals as a main ingredient having a high melting point, it is possible to improve the heat resistance of the external electrode 24. The thickness of the lower layer plating film is preferably about 0.2 µm or more and about 5.0 µm or less, for example. The lower layer plating film may include a plurality of plating films.

Preferably, the upper layer plating film is formed of Sn, Ag, Au, or an alloy containing at least one metal selected from these metals as a main ingredient. More preferably, the upper layer plating film is formed of Sn or an alloy containing Sn as a main ingredient. By forming the upper layer plating film of Sn or an alloy containing Sn as a main ingredient, it is possible to improve the solderability between the metal terminal 40A and the external electrode 24. The thickness of the upper layer plating film is preferably about 1.0 µm or more and about 5.0 µm or less, for example. The upper layer plating film may include a plurality of layers.

When a single layer defines the plating film, it is preferred to provide an upper layer plating film having excellent solderability.

The joining material 60 is used to join the first external electrode 24a, and the terminal joint portion 50 of one of the metal terminals 40A, and to join the second external electrode 24b, and the terminal joint portion 50 of the other of the metal terminals 40A. As the joining material 60, LF solders such as Sn—Sb system, Sn—Ag—Cu system, Sn—Cu system, Sn—Bi system can be used. Particularly, in the case of a Sn—Sb system solder, the content of Sb is preferably about 5% or more and about 15% or less, for example.

According to the multilayer ceramic electronic component 10 of the first preferred embodiment, the first external electrode 24a is disposed only on the first end surface 14e of the laminate 14, and the second external electrode 24b is disposed only on the second end surface 14f of the laminate 14. Therefore, it is possible to reduce the tensile stress on an e-dimensional end portion due to reduction in the total volume of the external electrode 24 (the base electrode layer and the plating layer), and it is possible to prevent occurrence of cracking from the e-dimensional end portion of the external electrode 24. As a result, it becomes possible to use a terminal of phosphor bronze (otherwise with excellent heat conduction and low electric resistance) which is a countermeasure against the heat generation, and thus it is possible to greatly ameliorate the rate of occurrence of cracking even with a copper terminal having a large linear coefficient expansion.

In joining the pair of metal terminals 40A to the external electrode 24 of the electronic component body 12, the joining material 60 does not extend around the first and the second principal surfaces 14a and 14b, and the first and the second lateral surfaces 14c and 14d of the laminate 14, and the external electrode 24 (in particular, the portions of the end surface center portions 26a and 26b) is flat. Therefore, the posture of the electronic component body 12 is ameliorated, and a so-called chip shift is able to be prevented.

Also, according to the multilayer ceramic electronic component 10 of the first preferred embodiment, the first external electrode 24a includes the saddle portion 28a with a thickness larger than the thickness of the first external electrode 24a in the end surface center portion 26a situated in the center portion of the first external electrode 24a in the periphery of the first end surface 14e in planar view from the direction linking the first end surface 14e and the second end surface 14f, and the second external electrode 24b includes the saddle portion 28b with a thickness larger than the thickness of the second external electrode 24b in the end surface center portion 26b situated in the center portion of the second external electrode 24b in the periphery of the second end surface 14f in planar view from the direction linking the first end surface 14e and the second end surface 14f. Therefore, it is possible to ensure the thickness of the external electrode 24 in corner portions of the laminate 14, and thus it is possible to ensure the sealability of the external electrode 24 to the laminate 14. Therefore, it becomes possible to prevent the plating liquid from entering the internal electrode layer 18 in forming the plating layers 32a and 32b, and it becomes possible to prevent the deterioration in the reliability of the electronic component body 12.

Also by providing the first external electrode 24a on the first end surface 14e with the saddle portion 28a, and providing the second external electrode 24b on the second end surface 14f with the saddle portion 28b, the end surface center portion 26a situated in the center portion of the first external electrode 24a, and the end surface center portion 26b situated in the center portion of the second external electrode 24b are flat or substantially flat, so that it is possible to join the external electrode 24 and the metal terminal 40A uniformly with a small amount of the joining material 60. Here, since the amount of the joining material 60 is able to be reduced, it is possible to prevent the electronic component body 12 from shifting by melting of the joining material 60 in mounting the multilayer ceramic electronic component 10 on the mounting board. Further, since the distance between the electronic component body 12 and the metal terminal 40A is reduced, heat radiation is improved (namely, thermal resistance decreases). Thus, owing to the improvement in heat radiation, it is possible to provide the multilayer ceramic electronic component 10 that is able to be used in a higher loading environment.

Further, according to the multilayer ceramic electronic component 10 of the first preferred embodiment, each of the pair of metal terminals 40A includes the terminal joint portion 50 connected with the first end surface 14e or the second end surface 14f, the extended portion 52 connected with terminal joint portion 50 and extending in the mounting direction from the terminal joint portion 50, and the mounting portion 54 connected with the extended portion 52 and extending in the direction linking the first end surface 14e and the second end surface 14f from the extended portion 52, and the extended portion 52 defines a gap between the bottom surface of the electronic component body 12 (the second principal surface 14b) and the mounting portion 54. Thus, by interposing the pair of metal terminals 40A between the electronic component body 12 and the mounting board, it is possible to prevent the thermal shock from exerting on the electronic component body 12, and thus the solder cracking resistance is improved. Even when a stress due to temperature change or deformation of the mounting board occurs, stress is advantageously absorbed by the elastic deformation of the metal terminal 40A.

The first to the third modified examples of the metal terminal used in the multilayer ceramic electronic component of the first preferred embodiment of the present invention will be described by referring to FIG. 5 to FIG. 7.

Figure 5A:
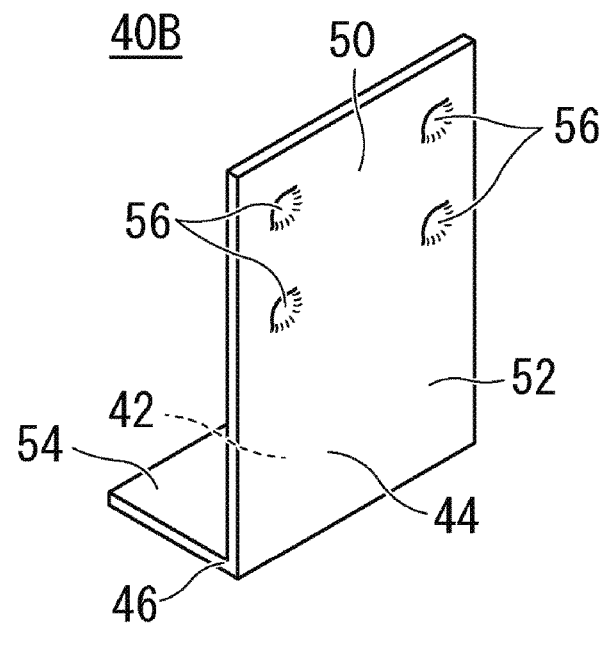
FIG. 5A is an external perspective view showing a first modified example of the metal terminal used in the multilayer ceramic electronic component according to the first preferred embodiment of the present invention.
Figure 5B:
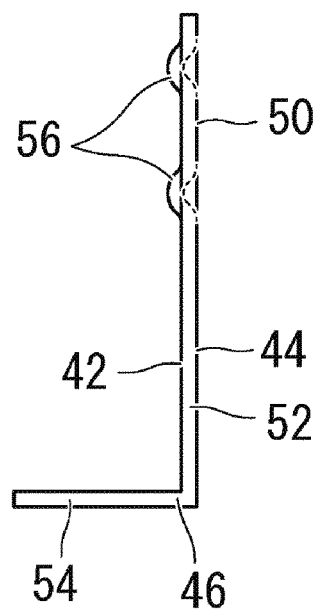
FIG. 5B is a side view showing the first modified example of the metal terminal used in the multilayer ceramic electronic component according to the first preferred embodiment of the present invention.

FIG. 5A is an external perspective view showing the first modified example of the metal terminal used in the multilayer ceramic electronic component according to the first preferred embodiment of the present invention, and FIG. 5B is a side view showing the first modified example of the metal terminal used in the multilayer ceramic electronic component according to the first preferred embodiment of the present invention. In the metal terminal 40B shown in FIGS. 5A and 5B, the same portion as that in the metal terminal 40A shown in FIG. 4 is denoted by the same reference numeral and the description thereof will be omitted.

The metal terminal 40B shown in FIGS. 5A and 5B is different from the metal terminal 40A in that in the terminal joint portion 50, a total of four protruding portions 56 that preferably are convex from the other principal surface 44 toward the one principal surface 42 are provided. This protruding portion 56 and the external electrode 24 are joined by the joining material 60. The joining material 60 concentrates in the protruding portion 56 by the capillary action. As a result, a gap is provided between the external electrode 24 and the metal terminal 40B while the joining strength between the external electrode 24 and the metal terminal 40B is increased.

For the multilayer ceramic electronic component 10, the multilayer ceramic electronic component including the metal terminal 40B achieves the same operational effect as the metal terminal 40A shown in FIG. 4, and also achieves the following effects.

More specifically, the distance between the electronic component body 12 and the metal terminal 40B is extended by the length protruding from the one principal surface 42 of the protruding portion 56, and a gap is able to be provided between the metal terminal 40B and the external electrode 24. Therefore, a layer of the joining material 60 is able to be provided in the gap, and oscillation of the electronic component body 12 is transferred to the metal terminal 40B via the layer defined by the joining material 60 (joining layer), so that it is possible to attenuate the transfer of oscillation to the metal terminal 40B, and to obtain the acoustic noise suppressing effect.

If the amount of the joining material 60 is large, the joining material 60 is able to extend to the extended portion 52 of the metal terminal 40B, and in this case, the spring performance of the metal terminal 40B can be lost due to the joining material 60 running on the extended portion 52 of the metal terminal 40B. Therefore, the acoustic noise suppressing effect is reduced. In light of this, by providing the protruding portion 56, the joining material 60 concentrates into a gap defined by the protruding portion 56 by the capillary action, so that even when the amount of the joining material 60 is large, it is possible to prevent the joining material 60 from running on the extended portion 52 of the metal terminal 40B.

Figure 6:
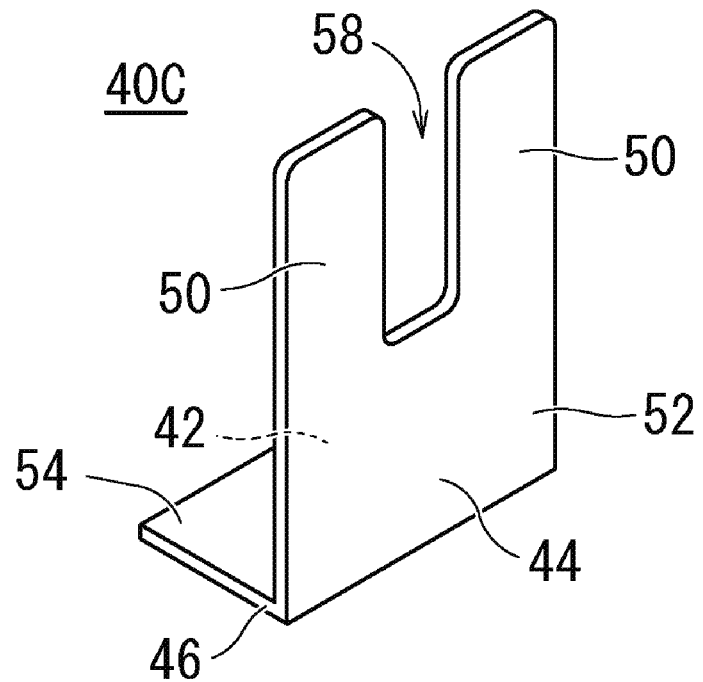
FIG. 6 is an external perspective view showing a second modified example of the metal terminal used in the multilayer ceramic electronic component according to the first preferred embodiment of the present invention.

Next, FIG. 6 is an external perspective view showing the second modified example of the metal terminal used in the multilayer ceramic electronic component according to the first preferred embodiment of the present invention. In the metal terminal 40C shown in FIG. 6, the same portion as that in the metal terminal 40A shown in FIG. 4 is denoted by the same reference numeral and the description thereof will be omitted.

The metal terminal 40C shown in FIG. 6 is different from the metal terminal 40A in that in the center of the width direction of the terminal joint portion 50, a notch 58 is provided from the upper end side to the middle portion. By providing the notch 58 in the terminal joint portion 50, the terminal is divided into one piece and the other piece.

For the multilayer ceramic electronic component 10, the multilayer ceramic electronic component including the metal terminal 40C achieves the same operational effect as the metal terminal 40A shown in FIG. 4, and also achieves the following effects.

More specifically, in general, when an electric field is applied to a dielectric, the crystal lattice is distorted by the dielectric phenomenon, so that the dielectric expands in the direction parallel or substantially parallel with the electric field, and contracts in the direction perpendicular to the electric field. While the opposed electrode portion 22a to which the electric field is applied largely expands and contracts, the outer layer portion 16a, the lateral portion (W gap) 22b of the laminate 14, and the end portion (L gap) 22c of the laminate which are other parts than the opposed electrode portion 22a do not significantly expand and contract. In other words, the portions located farther outward than the opposed electrode portion 22a of the laminate 14 do not significantly expand and contract.

Figure 7:
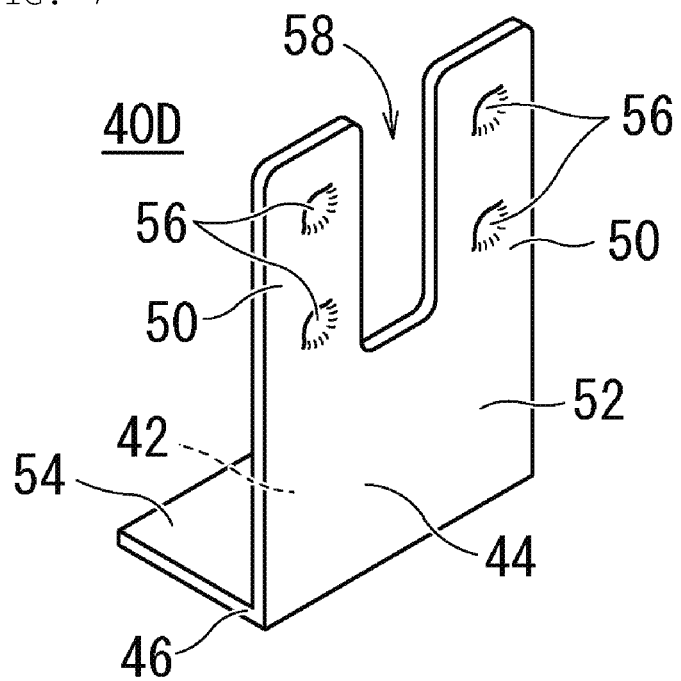
FIG. 7 is an external perspective view showing a third modified example of the metal terminal used in the multilayer ceramic electronic component according to the first preferred embodiment of the present invention.

Therefore, as shown in FIG. 7, when the metal terminal 40C is provided with the notch 58, and the metal terminal is not joined in the center portion of the opposed electrode portion 22a that is greatly variable, but joined in the periphery of the lateral portion (W gap) 22b of the laminate 14 that is little deformed, the metal terminal 40C does not significantly deform in association with the deformation of the opposed electrode portion 22a. Therefore, oscillation of the opposed electrode portion 22a is less likely to be transferred to the board via the metal terminal 40C. Therefore, it is possible to prevent the occurrence of the board acoustic noise caused by the electrostriction of the multilayer ceramic electronic component more effectively.

Next, FIG. 7 is an external perspective view showing a third modified example of the metal terminal used in the multilayer ceramic electronic component according to the first preferred embodiment of the present invention. In the metal terminal 40D shown in FIG. 7, the same portion as that in the metal terminal 40A shown in FIG. 4 is denoted by the same reference numeral and the description thereof will be omitted.

The metal terminal 40D shown in FIG. 7 is different from the metal terminal 40A in that in the terminal joint portion 50, a total of four protruding portions 56 that are convex from the other principal surface 44 toward the one principal surface 42 are provided, and in the center of the width direction of the terminal joint portion 50, the notch 58 extends from the upper end side to the middle portion. As a result, the same operational effect as the metal terminal 40B shown in FIG. 5 and the same operational effect as the metal terminal 40C shown in FIG. 6 are achieved.

Second Preferred Embodiment

Figure 8:
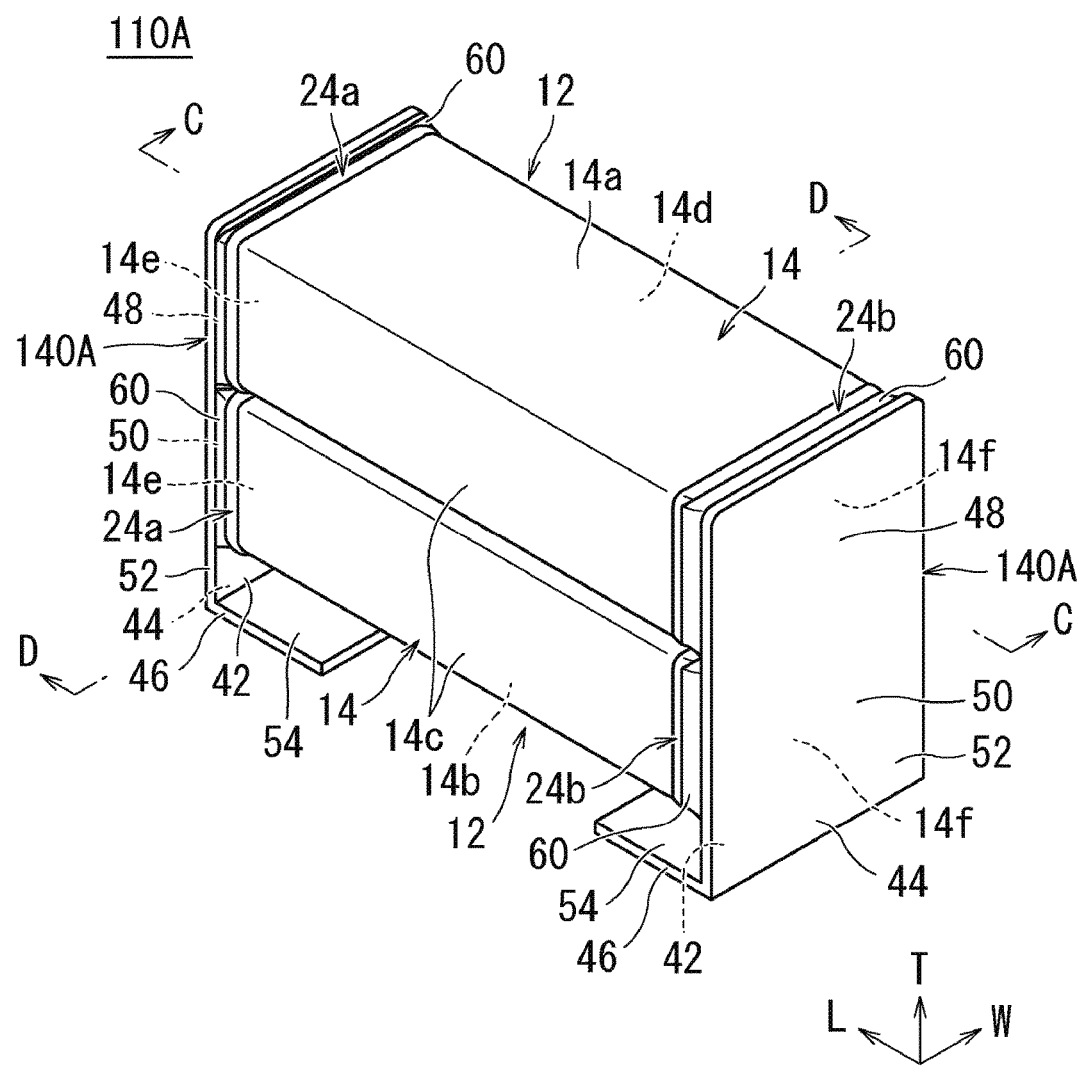
FIG. 8 is an external perspective view showing one example of a multilayer ceramic electronic component according to the second preferred embodiment of the present invention.
Figure 9A:
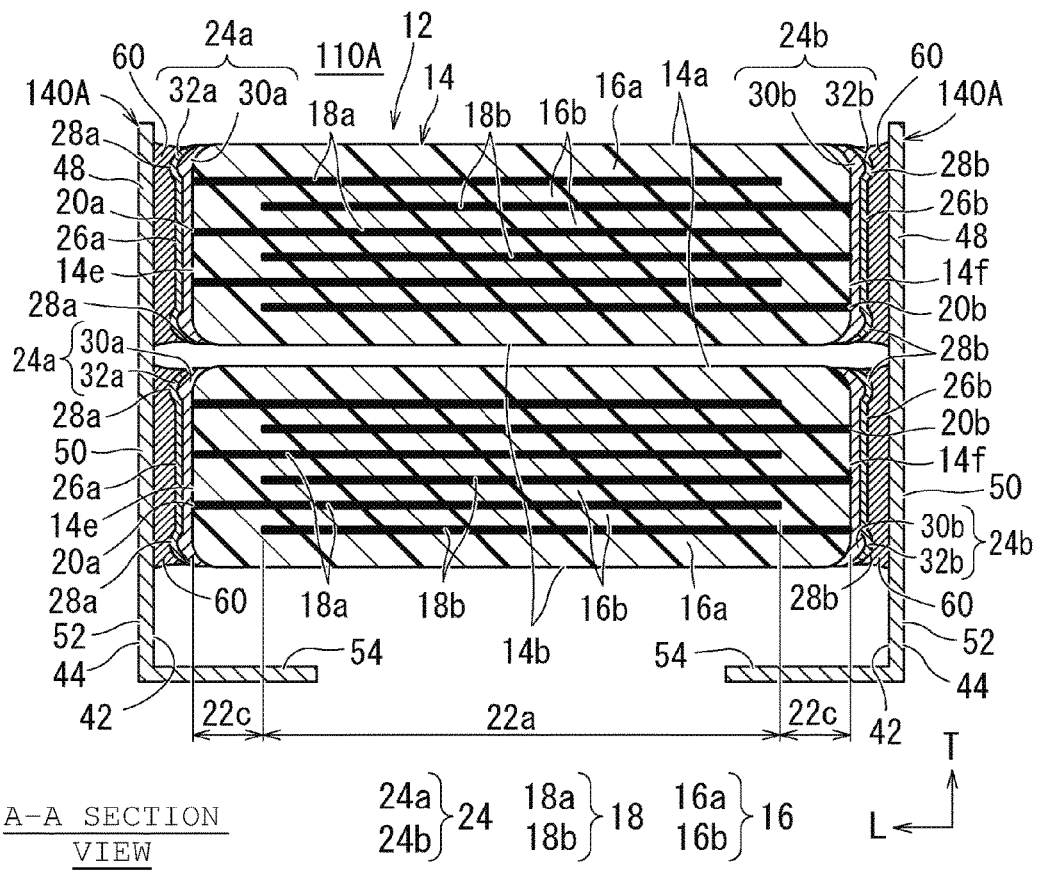
FIG. 9A is a section view taken along C-C of FIG. 8 showing a multilayer ceramic electronic component according to the second preferred embodiment of the present invention.
Figure 9B:
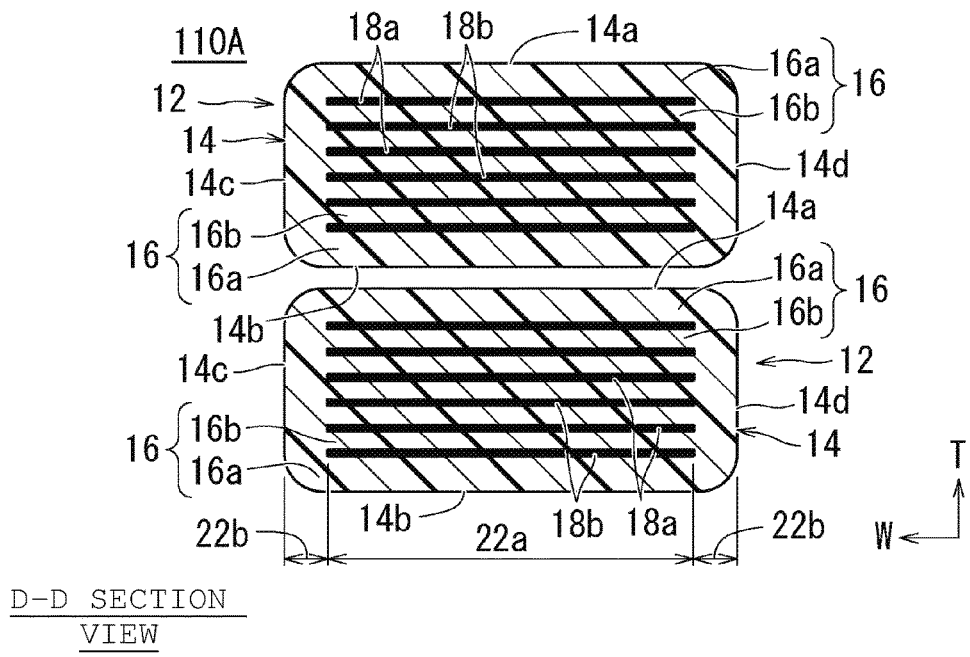
FIG. 9B is a section view taken along D-D of FIG. 8 showing the multilayer ceramic electronic component according to the second preferred embodiment of the present invention.

A multilayer ceramic electronic component according to the second preferred embodiment of the present invention will be described. FIG. 8 is an external perspective view showing one example of a multilayer ceramic electronic component according to the second preferred embodiment of the present invention. FIG. 9A is a section view taken along C-C of FIG. 8 showing a multilayer ceramic electronic component according to the second preferred embodiment of the present invention, and FIG. 9B is a section view taken along D-D of FIG. 8 showing the multilayer ceramic electronic component according to the second preferred embodiment of the present invention. A multilayer ceramic electronic component 110A according to this preferred embodiment has the same configuration as the multilayer ceramic electronic component 10 described with reference to FIG. 1 except that a pair of metal terminals 140A is of the type that sandwiches the two electronic component bodies 12 stacked in the vertical direction. Therefore, the same portion as that in the multilayer ceramic electronic component 10 shown in FIG. 1 is denoted by the same reference numeral and the description thereof will be omitted.

In the multilayer ceramic electronic component 110A according to the second preferred embodiment, the first external electrode 24a provided in the two electronic component bodies 12 is disposed only on the first end surface 14e, and the second external electrode 24b is disposed only on the second end surface 14f. The first external electrode 24a provided on the two electronic component bodies 12 includes the saddle portion 28a, and the second external electrode 24b includes the saddle portion 28b. The pair of metal terminals 140A provided in the multilayer ceramic electronic component 110A according to the second preferred embodiment is of the type that sandwiches the two electronic component bodies 12 stacked in the vertical direction. Therefore, the metal terminal 140A includes a terminal joint portion 48 joined with the electronic component body 12 of the upper stage and the terminal joint portion 50 joined with the electronic component body 12 of the lower stage.

The multilayer ceramic electronic component 110A shown in FIG. 8 and FIG. 9 achieves the same effect as the multilayer ceramic electronic component 10 according to the first preferred embodiment.

That is, in the multilayer ceramic electronic component 110A, since the first external electrode 24a provided on the two electronic component bodies 12 is disposed only on the first end surface 14e, and the second external electrode 24b is disposed only on the second end surface 14f, it is possible to reduce the tensile stress on an e-dimensional end part due to reduction in the total volume of the external electrode 24, and it is possible to prevent occurrence of cracking from the e-dimensional end portion of the external electrode 24.

In the multilayer ceramic electronic component 110A, since the first external electrode 24a provided on the two electronic component bodies 12 includes the saddle portion 28a, and the second external electrode 24b includes the saddle portion 28b, it is possible to ensure the thickness of the external electrode 24 in corner portions of each laminate 14, and thus it is possible to ensure the sealability of the external electrode 24 to the laminate 14.

Further, in the multilayer ceramic electronic component 110A, the metal terminal 140A includes the terminal joint portion 48 joined with the electronic component body 12 of the upper stage, and the terminal joint portion 50 joined with the electronic component body 12 of the lower stage, and by interposing the pair of metal terminals 140A between the two electronic component bodies 12 and the mounting board, it is possible to prevent the thermal shock from exerting on the two electronic component bodies 12, so that the solder cracking resistance is improved. Even when a stress due to temperature change or deformation of the mounting board occurs, the stress is advantageously absorbed by the elastic deformation of the metal terminal 140A.

Figure 10:
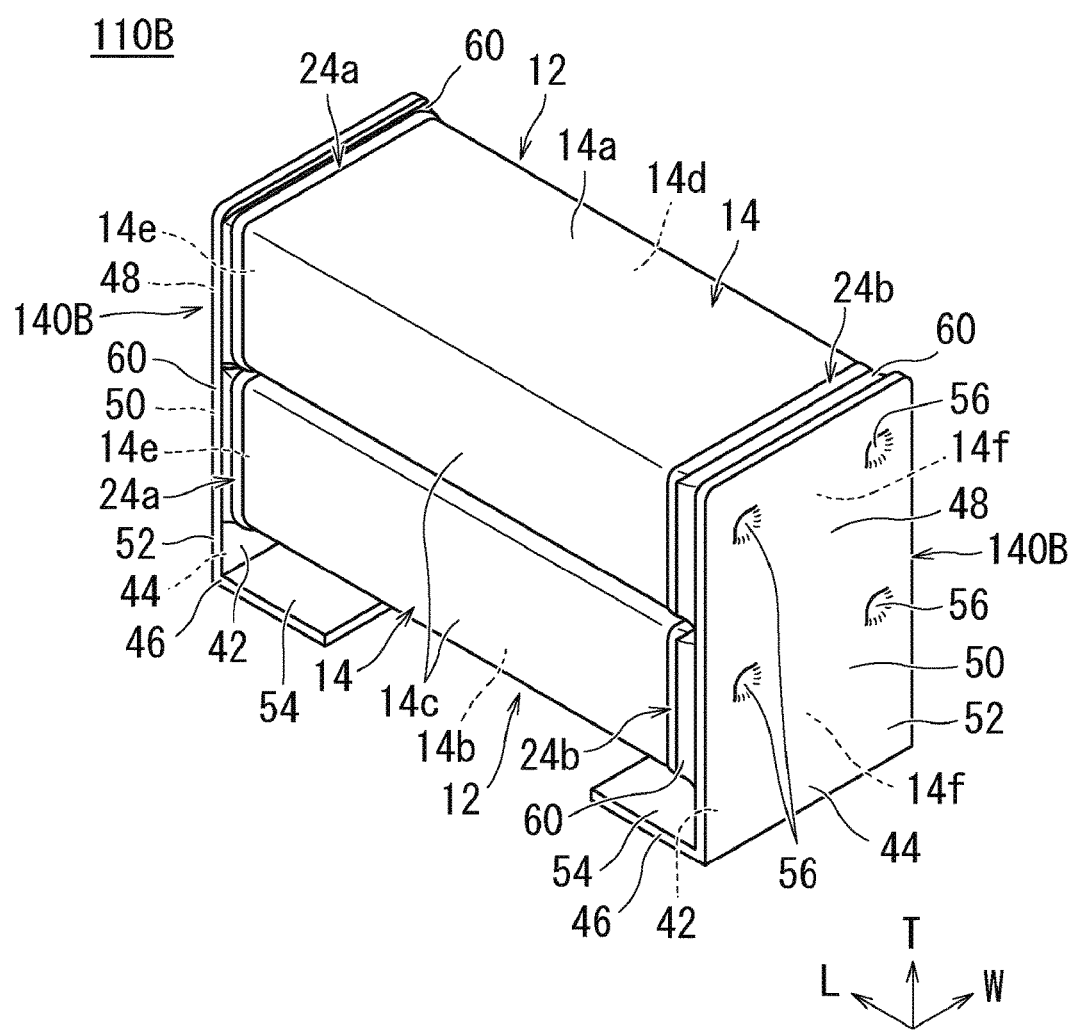
FIG. 10 is an external perspective view showing a first modified example of the multilayer ceramic electronic component according to the second preferred embodiment of the present invention.

The first modified example of the multilayer ceramic electronic component according to the second preferred embodiment of the present invention will be described. FIG. 10 is an external perspective view showing the first modified example of the multilayer ceramic electronic component according to the second preferred embodiment of the present invention. In the multilayer ceramic electronic component 110B of this modified example, the same portion as that in multilayer ceramic electronic component 110A shown in FIG. 8 is denoted by the same reference numeral and the description thereof will be omitted.

The metal terminal 140B provided in the multilayer ceramic electronic component 110B shown in FIG. 10 is different from the metal terminal 140A provided in the multilayer ceramic electronic component 110A shown in FIG. 8 in that in the terminal joint portion 48 and the terminal joint portion 50, a total of four protruding portions 56 that are convex from the other principal surface 44 toward the one principal surface 42 are provided.

The multilayer ceramic electronic component 110B shown in FIG. 10 achieves the same operational effect as the multilayer ceramic electronic component 110A shown in FIG. 8, and also achieves the following effects.

More specifically, the distance between the two electronic component bodies 12 and the metal terminal 140B is extended by the length protruding from the one principal surface 42 of the protruding portion 56, and a gap is able to be provided between the metal terminal 140B and the external electrode 24. Therefore, a layer of the joining material 60 is able to be provided in the gap, and oscillation of the two electronic component bodies 12 is transferred to the metal terminal 140B via the layer formed by the joining material 60 (joining layer), so that it is possible to attenuate the transfer of oscillation to the metal terminal 140B, and to obtain the acoustic noise suppressing effect.

Figure 11:
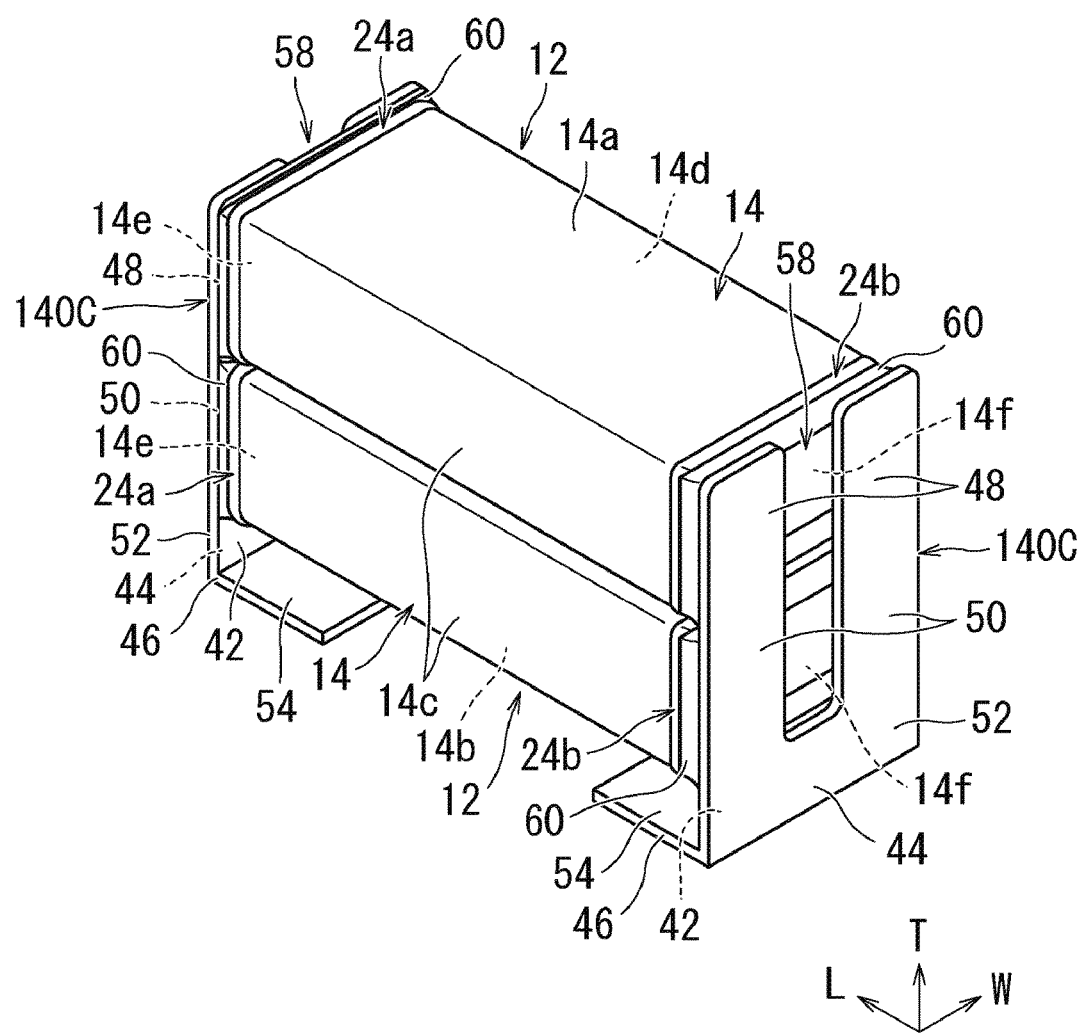
FIG. 11 is an external perspective view showing a second modified example of the multilayer ceramic electronic component according to the second preferred embodiment of the present invention.

The second modified example of the multilayer ceramic electronic component according to the second preferred embodiment of the present invention will be described. FIG. 11 is an external perspective view showing the second modified example of the multilayer ceramic electronic component according to the second preferred embodiment of the present invention. In the multilayer ceramic electronic component 110C of this modified example, the same portion as that in multilayer ceramic electronic component 110A shown in FIG. 8 is denoted by the same reference numeral and the description thereof will be omitted.

The metal terminal 140C provided in the multilayer ceramic electronic component 110C shown in FIG. 11 is different from the metal terminal 140A provided in the multilayer ceramic electronic component 110A shown in FIG. 8 in that in the center of the width direction of the terminal joint portion 48, the notch 58 extends from the upper end side to the middle portion of the terminal joint portion 50.

The multilayer ceramic electronic component 110C shown in FIG. 11 achieves the same operational effect as the multilayer ceramic electronic component 110A shown in FIG. 8, and also achieves the same operational effect as the metal terminal 40B shown in FIG. 5.

Figure 12:
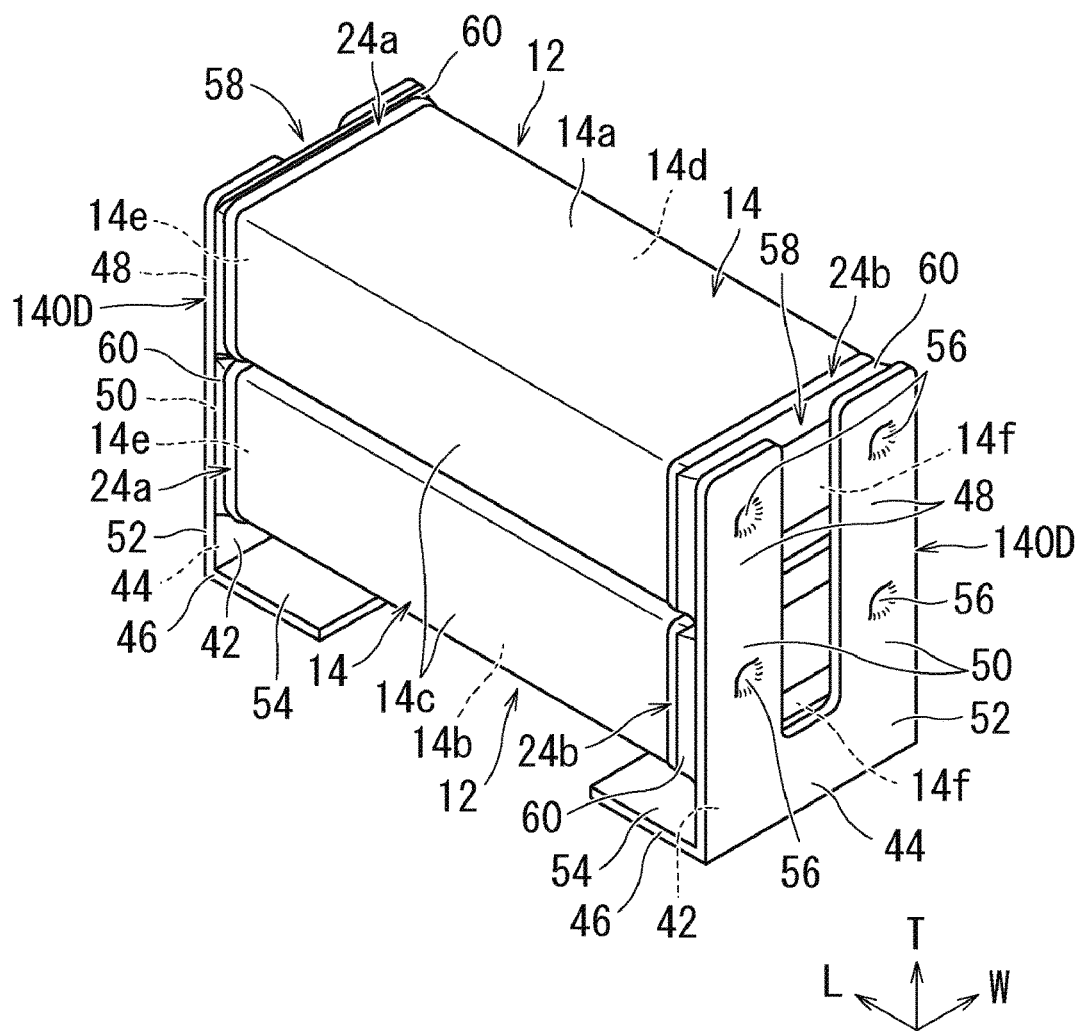
FIG. 12 is an external perspective view showing a third modified example of the multilayer ceramic electronic component according to the second preferred embodiment of the present invention.

The third modified example of the multilayer ceramic electronic component according to the second preferred embodiment of the present invention will be described. FIG. 12 is an external perspective view showing the third modified example of the multilayer ceramic electronic component according to the second preferred embodiment of the present invention. In the multilayer ceramic electronic component 110D of this modified example, the same portion as that in multilayer ceramic electronic component 110A shown in FIG. 8 is denoted by the same reference numeral and the description thereof will be omitted.

The metal terminal 140D shown in FIG. 12 is different from the metal terminal 140A in that in the terminal joint portions 48 and 50, a total of four protruding portions 56 that are convex shaped from the other principal surface 44 toward the one principal surface 42 are provided, and in the center of the width direction of the terminal joint portions 48 and 50, the notch 58 extends from the upper end side to the middle portion.

The multilayer ceramic electronic component 110D shown in FIG. 12 achieves the same operational effect as the multilayer ceramic electronic component 110A shown in FIG. 8, and also achieves the same operational effect as the metal terminal 40B shown in FIG. 5, and the same operational effect as the metal terminal 40C shown in FIG. 6.

Next, one preferred embodiment of a producing method of the multilayer ceramic electronic component having the aforementioned configuration will be described by taking the multilayer ceramic electronic component 10 as an example.

At first, a ceramic green sheet, a conductive paste for internal electrode to define the internal electrode layer 18, and a conductive paste for external electrode to define the external electrode 24 are prepared.

The ceramic green sheet, the conductive paste for internal electrode and the conductive paste for external electrode contain an organic binder and a solvent, and known organic binders and organic solvent are able to be used.

Then, on the ceramic green sheet, for example, the conductive paste for internal electrode is applied in a predetermined pattern, and thus a pattern of internal electrode is formed on the ceramic green sheet.

The conductive paste for internal electrode is able to be applied by a known method such as screen printing.

Next, a predetermined number of ceramic green sheets for outer layer on which an internal electrode pattern is not applied are stacked, and ceramic green sheets on which an internal electrode pattern is applied are sequentially stacked thereon, and a predetermined number of ceramic green sheets for outer layer are stacked thereon, and thus a mother laminate is prepared. The mother laminate may be pressure bonded in the laminating direction by isostatic pressing or the like as needed.

Thereafter, the mother laminate is cut into a predetermined size and a raw laminate chip is cut out. At this time, corner portions and ridge portions of the laminate may be rounded by barrel finishing or the like. Subsequently, the cutout raw laminate chip is fired to generate a laminate. The firing temperature of the raw laminate chip is preferably about 900° C. or more and about 1300° C. or less depending on the material of the ceramic or the material of the conductive paste for internal electrode, for example.

Next, on the both end surfaces of the fired laminate, a conductive paste for external electrode is applied, and baked, and thus the base electrode layer 30a of the first external electrode 24a and the base electrode layer 30b of the second external electrode 24b are formed. The baking temperature is preferably about 700° C. or more and about 900° C. or less, for example.

At the time of formation of the base electrode layer 30a, by forming a film by screen printing method in applying a conductive paste for external electrode on the first end surface 14e of the laminate 14, it is possible to form the saddle portion 28a having a thickness larger than the thickness of the first external electrode 24a in the center portion (the end surface center portion 26a) of the first end surface 14e in the periphery of the first end surface 14e in planar view from the direction linking the first end surface 14e and the second end surface 14f. As a result, the first external electrode 24a is able to have such a structure that the first external electrode 24a does not fold back to the first and the second principal surfaces 14a and 14b, and the first and the second lateral surfaces 14c and 14d of the laminate 14.

Likewise, at the time of formation of the base electrode layer 30b, by forming a film by screen printing method in applying a conductive paste for external electrode on the second end surface 14f of the laminate 14, it is possible to form the saddle portion 28b having a thickness larger than the thickness of the second external electrode 24b in the center portion (the end surface center portion 26b) of the second end surface 14f in the periphery of the second end surface 14f in planar view from the direction linking the first end surface 14e and the second end surface 14f. As a result, the second external electrode 24b is able to have such a structure that the second external electrode 24b does not fold back to the both principal surfaces 14a and 14b, and the both lateral surfaces 14c and 14d of the laminate 14.

At this time, by controlling the viscosity and the amount of the conductive paste for external electrode, it is possible to control the height (thickness) of the saddle portions 28a and 28b.

Also, the plating layer 32a is formed on the surface of the base electrode layer 30a, and the plating layer 32b is formed on the surface of the base electrode layer 30b as needed.

Sequentially, an attaching process of the metal terminal in the producing method of the multilayer ceramic electronic component according to a preferred embodiment of the present invention will be described.

First, an intended pair of metal terminals 40A is prepared.

Then one of the prepared metal terminals 40A is attached to the first external electrode 24a of the electronic component body 12 by the joining material 60, and the other of the prepared metal terminals 40A is attached to the second external electrode 24b of the electronic component body 12 by the joining material 60. Attachment of the pair of metal terminals 40A is conducted by setting the temperature of soldering by the joining material 60 at about 270° C. or more and about 290° C. or less by reflow, and applying the heat for about 30 seconds or more, for example.

As described above, the multilayer ceramic electronic component 10 shown in FIG. 1 is produced.

Then for the multilayer ceramic electronic component 10 obtained in the manner as described above, experiments of checking the occurrence of cracking based on predetermined conditions and checking the moisture resistance reliability were conducted.

As an example, an electronic component body (multilayer ceramic capacitor) having the following specification was prepared according to the aforementioned producing method of the multilayer ceramic electronic component.

Chip size (design value): Length×Width×Height=7.5 mm×6.3 mm×3.2 mm

Material of ceramic layer: $BaTiO_3$

Material of internal electrode layer: Ni

Structure of external electrode: structure containing base electrode layer (baked layer) and plating layer Material of base electrode layer (baked layer): Cu Plating layer: two-layer structure of Ni plating and Sn plating External electrode: Formed only on both end surfaces of laminate. Further, a saddle portion is formed so as to surround peripheries of first end surface and second end surface of laminate.

Also in the Example, the specification of the pair of metal terminals joined with the prepared electronic component body is as follows. As the joining material for joining the external electrode of the electronic component body and the metal terminal, an LF solder was used.

Metal terminal: two-layer structure of terminal body and plating film

Terminal body: SUS430

Plating film: two-layer structure of lower layer plating and upper layer plating. Material of lower layer plating is Cu, and material of upper layer plating is Sn.

The multilayer ceramic electronic component according to Comparative Example is different from the multilayer ceramic electronic component according to Example in that the external electrode is formed from the first end surface of the laminate to a portion of the first and the second principal surfaces, and to a portion of the first and the second lateral surfaces, and is formed to extend from the second end surface of the laminate to a portion of the first and the second principal surfaces, and to a portion of the first and the second lateral surfaces, and a saddle portion is not formed in the respective external electrodes. Other conditions were the same with those of Example.

For each experiment, 20 samples were prepared for each of Example, Comparative Example 1 and Comparative Example 2.

For each sample, an LF solder was reflow mounted on a glass epoxy board as a mounting board. Then in a test vessel (gas phase), a total of 1000 cycles was conducted. Each cycle included about −55° C./30 min. to about 125° C./30 min, for example.

The sample extracted after 1000 cycles was ground from the lateral surface to near the center of the terminal joint portion (of the LT surface) while it was kept attached with the board, and presence of cracking of the tip end of the external electrode was observed.

In conducting this experiment, a heat treatment at 150° C. for 60 minutes followed by leaving still for 24 hours was conducted as a pretreatment, and leaving still for 24 hours was conducted as a posttreatment.

For each sample, an LF solder was reflow mounted on a glass epoxy board as a mounting board. Then for each sample, a rated voltage was applied in a high-temperature and high-moisture vessel at about 125° C., at a relative humidity of about 95% RH, at about 1.2 atmospheric pressure, and a moisture resistance loading acceleration test of about 144 hours was conducted. Occurrence of a short circuit was determined for the sample for which decrease in the insulation resistance value (IR value) by two digits or more was observed.

Regarding the experimental results of the experiments for checking occurrence of cracking, and the moisture resistance reliability test, the number of occurring cracks and the number of occurring short circuits are indicated in Table 1 for each of Example and Comparative Example.

TABLE 1

|  | Number of occurring cracks (number) | Number of occurring short circuits (number) |
| --- | --- | --- |
| Example | 0/20 | 0/20 |
| Comparative Example | 18/20 | 1/20 |

In the sample of the multilayer ceramic electronic component according to the Example, occurrence of cracking was not observed, and occurrence of a short circuit was not observed in any sample, and thus excellent result was obtained.

On the other hand, in the sample of the multilayer ceramic electronic component according to the Comparative Example, the occurrence of 18 cracks was observed, and occurrence of one short circuit was observed in the moisture resistance reliability test.

These results revealed that in the multilayer ceramic electronic components according to preferred embodiments of the present invention, the occurrence of cracking for the electronic component bodies is prevented, and high moisture resistance reliability is achieved.

The present invention is not limited to the aforementioned preferred embodiments, and are modified in various ways within the range of the scope of the present invention. The thickness of the ceramic layers, the number of layers, the opposite electrode area, and the dimension of the electronic component body are not limited to those described above.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
    an electronic component body including:
        a laminate including a plurality of laminated ceramic layers and a plurality of laminated internal electrode layers, and including first and second principal surfaces that are opposed to each other, first and second lateral surfaces that are opposed to each other, and first and second end surfaces that are opposed to each other;
        a first external electrode connected with the first end surface of the laminate; and
        a second external electrode connected with the second end surface of the laminate;
    a first metal terminal connected with the first external electrode; and
    a second metal terminal connected with the second external electrode; wherein
    the first and second external electrodes are disposed on the first and second end surfaces;
    the first and second external electrodes include a portion having a thickness larger than a thickness of a center portion of the first and second end surfaces in peripheries of the first and second end surfaces in a planar view from a direction linking the first and second end surfaces;

the center portion of the first and second end surfaces include a base electrode layer and a plating layer provided on the base electrode layer;

the first metal terminal includes a first terminal joint portion connected with the first end surface, a first extended portion connected with the first terminal joint portion and extending in a mounting surface direction, and a first mounting portion connected with the first extended portion and extending in a direction linking the end surfaces from the first extended portion;

the second metal terminal includes a second terminal joint portion connected with the second end surface, a second extended portion connected with the second terminal joint portion and extending in the mounting surface direction, and a second mounting portion connected with the second extended portion and extending in a direction linking the end surfaces from the extended portion;

the extended portion defines a gap between a bottom surface of the electronic component body and the first mounting portion or the second mounting portion.

2. The multilayer ceramic electronic component according to claim 1, wherein the portion of the first and second external electrodes having the larger thickness surrounds the peripheries of the first and second end surfaces.

3. The multilayer ceramic electronic component according to claim 1, wherein a base material of the first and second metal terminals is phosphor bronze.

4. The multilayer ceramic electronic component according to claim 1, wherein the electronic component body has rectangular or substantially rectangular parallelepiped shape.

5. The multilayer ceramic electronic component according to claim 1, wherein the ceramic layers are made of a dielectric material.

6. The multilayer ceramic electronic component according to claim 1, wherein the ceramic layers are made of a piezoelectric material.

7. The multilayer ceramic electronic component according to claim 1, wherein the ceramic layers are made of a semiconductor material.

8. The multilayer ceramic electronic component according to claim 1, wherein the ceramic layers are made of a magnetic material.

9. The multilayer ceramic electronic component according to claim 1, wherein each of the ceramic layers has a thickness of about 0.5 µm to about 10 µm.

10. The multilayer ceramic electronic component according to claim 1, wherein the internal electrode layers are parallel or perpendicular to the mounting surface direction.

11. The multilayer ceramic electronic component according to claim 1, wherein the laminate includes an opposed electrode portion where a first of the internal electrode layers and a second of the second internal electrode layers are opposed to each other, and a gap between one end in a width direction of the opposed electrode portion and a first lateral surface, and between the other end in the width direction of the opposed electrode portion and a second lateral surface.

12. The multilayer ceramic electronic component according to claim 1, wherein the laminate includes an opposed electrode portion where a first of the internal electrode layers and a second of the second internal electrode layers are opposed to each other, and a gap between an end portion on a side opposite to the first extended electrode portion of a first of the internal electrode layers and the second end surface, and between an end portion on a side opposite to a second extended electrode portion of a second of the internal electrode layers and the first end surface.

13. The multilayer ceramic electronic component according to claim 1, wherein each of the internal electrode layers has a thickness of about 0.1 µm to about 2 µm.

14. The multilayer ceramic electronic component according to claim 1, wherein the multilayer ceramic electronic component is a capacitor.

15. The multilayer ceramic electronic component according to claim 1, wherein a difference in thickness of the portion of the first and second external electrodes having the thickness larger than the thickness of the center portion of the first and second end surfaces in peripheries of the first and second end surfaces in the planar view from a direction linking the first and second end surfaces is about 0.1 µm to about 5.0 µm.

16. The multilayer ceramic electronic component according to claim 1, wherein a difference in thickness of the portion of the first and second external electrodes having the thickness larger than the thickness of the center portion of the first and second end surfaces in peripheries of the first and second end surfaces in the planar view from a direction linking the first and second end surfaces is about 2.0 µm to about 5.0 µm.

17. The multilayer ceramic electronic component according to claim 1, wherein each of the first external electrode and the second external electrode includes the base electrode layer and the plating layer on the base electrode layer.

18. The multilayer ceramic electronic component according to claim 17, wherein the base electrode layer includes at least one selected from a baked layer, a resin layer, and a thin film layer.

19. The multilayer ceramic electronic component according to claim 17, wherein the plating layer includes at least one metal selected from Cu, Ni, Sn, Ag, Pd, Ag—Pd alloy, Au, Bi, Zn or an alloy of the at least one metal.

20. The multilayer ceramic electronic component according to claim 17, wherein the plating layer includes a plurality of plating layers.

* * * * *